(12) United States Patent
Vogl

(10) Patent No.: US 10,483,729 B1
(45) Date of Patent: Nov. 19, 2019

(54) VENTED POWER DISTRIBUTION HOUSING

(71) Applicant: Littelfuse, Inc., Chicago, IL (US)

(72) Inventor: Lisa Vogl, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/256,504

(22) Filed: Jan. 24, 2019

(51) Int. Cl.
| *H02B 1/56* | (2006.01) |
| *H02B 1/18* | (2006.01) |
| *H02B 1/28* | (2006.01) |
| *H02B 1/46* | (2006.01) |
| *H05K 5/03* | (2006.01) |
| *H05K 5/02* | (2006.01) |

(52) U.S. Cl.
CPC ............... *H02B 1/565* (2013.01); *H02B 1/18* (2013.01); *H02B 1/28* (2013.01); *H02B 1/46* (2013.01); *H05K 5/0213* (2013.01); *H05K 5/03* (2013.01)

(58) Field of Classification Search
CPC .............................. H02B 1/56; H05K 7/20127
See application file for complete search history.

(56) References Cited

U.S. PATENT DOCUMENTS

| 5,823,378 A * | 10/1998 | Evarts ..................... F21V 31/03 220/374 |
| 9,616,769 B2 * | 4/2017 | Jung ....................... B60L 15/20 |
| 9,769,951 B2 * | 9/2017 | Ding ..................... H05K 5/0213 |
| 2018/0206360 A1 * | 7/2018 | Dent ................. H05K 7/20127 |

* cited by examiner

*Primary Examiner* — Mukundbhai G Patel

(57) ABSTRACT

Provided is a power distribution assembly including a power distribution housing. In some approaches, the power distribution housing includes a base having a main wall, a sidewall extending from the main wall, and a vent through the main wall. The vent may include a vent opening extending between an interior surface of the main wall and an exterior surface of the main wall. A plurality of passageways may be recessed into the exterior surface of the main wall, the plurality of passageways extending between the vent opening and the sidewall. The power distribution housing may further include a cover removably coupled to the base, the cover and the base defining an interior cavity operable to house at least one fusible element.

20 Claims, 5 Drawing Sheets

VENTED POWER DISTRIBUTION HOUSING

FIELD OF THE DISCLOSURE

The disclosure relates generally to power distribution modules and, more particularly, to a vented power distribution module housing.

BACKGROUND OF THE DISCLOSURE

Power distribution housings, also referred to as "junction boxes," have traditionally been used to house electrical components such as fuse blocks, fuses, relays, and the like. Typically, these electrical components are collectively capable of distributing power in an electrical system to one or more electrical loads, such as a refrigeration unit in a tractor/trailer combination. Mating harness connectors or ring terminals may be plugged into one or more of the electrical components within the housing to enable power distribution to the one or more electrical loads. Exposure of the power distribution housing to adverse environments and weather conditions can damage or destroy electrical components within the housing.

Various power distribution housings have been developed that are intended to protect internal electrical components from adverse external conditions. However, completely sealed power distribution housings can cause a pressure differential between internal and external areas of the power distribution housing due to temperature changes. The increased pressure causes stress on seals and cover latches of the power distribution housing.

It is with respect to these and other considerations that the present improvements may be useful.

SUMMARY

A power distribution housing according to embodiments of the present disclosure may include a base having a main wall and a sidewall extending from the main wall. The base may further include a vent through the main wall, the vent including a vent opening extending between an interior surface of the main wall and an exterior surface of the main wall. The base may include a plurality of passageways recessed into the exterior surface of the main wall, the plurality of passageways extending between the vent opening and the sidewall. The power distribution housing may further include a cover removably coupled to the base, the cover and the base defining an interior cavity operable to house at least one fusible element.

A power distribution assembly according to embodiments of the present disclosure may include a power distribution housing having a base and a cover defining an interior cavity operable to house at least one fusible element. The base may include a main wall flush mountable on a surface, a sidewall extending from the main wall, and a vent through the main wall. The vent may include a vent opening extending between an interior surface of the main wall and an exterior surface of the main wall, and a plurality of passageways recessed into the exterior surface of the main wall, the plurality of passageways extending between the vent opening and the sidewall.

A power distribution housing according to embodiments of the present disclosure may include a base couplable with a cover, wherein the cover and the base define an interior cavity containing at least one fusible element coupled to the base. The base may include a main wall, a sidewall extending from the main wall, and a vent through the main wall. The vent may include a vent opening extending between an interior surface of the main wall and an exterior surface of the main wall, and a plurality of passageways recessed into the exterior surface of the main wall. The plurality of passageways may extend between the vent opening and the sidewall.

Figure 1:
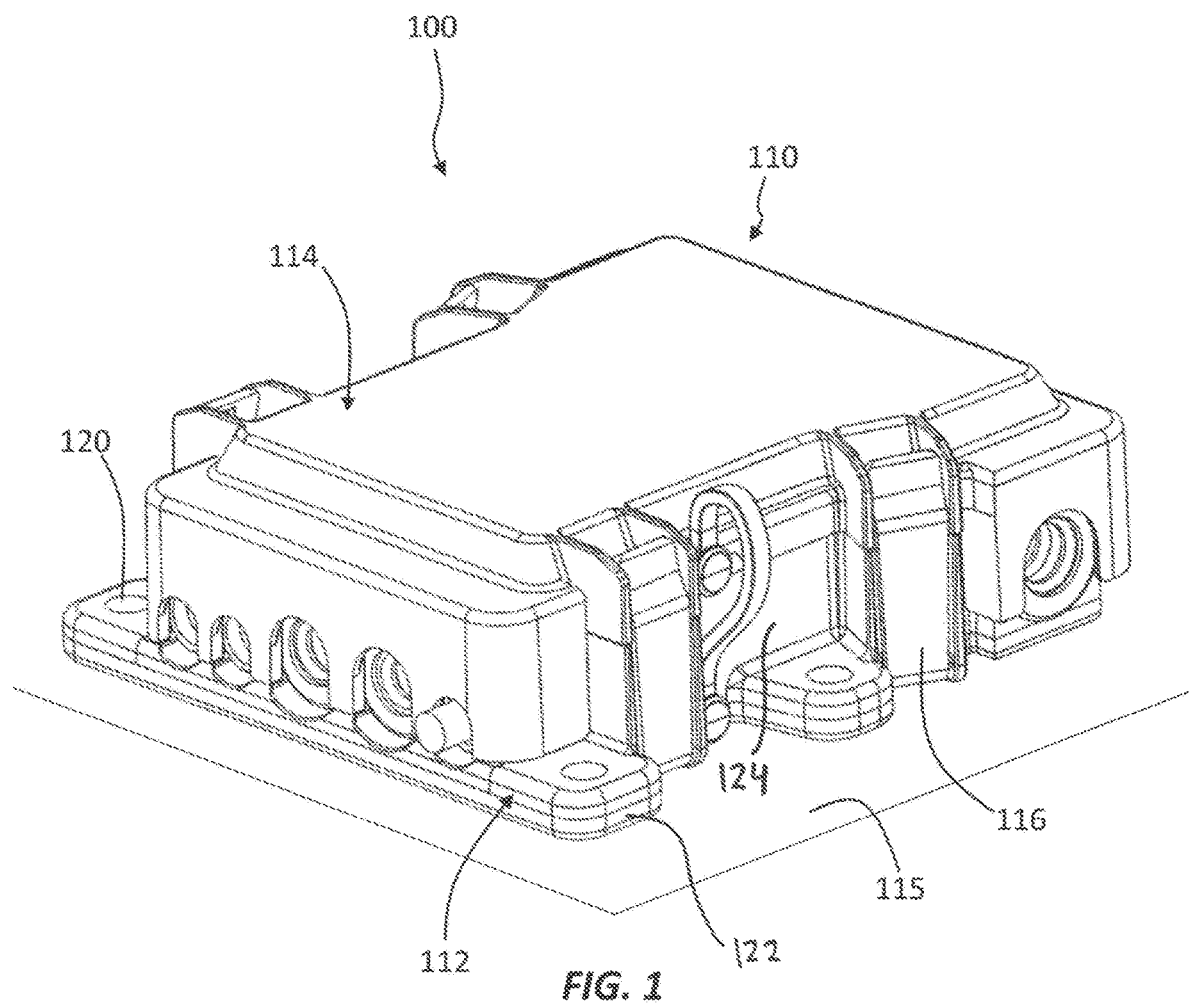
FIG. 1 is an isometric view illustrating a power distribution assembly according to embodiments of the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

A power distribution assembly and a power distribution housing in accordance with the present disclosure will now be described more fully hereinafter with reference to the accompanying drawings, in which embodiments are shown. The power distribution assembly and power distribution housing, however, may be embodied in many different forms and should not be construed as being limited to the embodiments set forth herein. Rather, these embodiments are provided so that this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of the power distribution assembly and/or the power distribution housing as they appear in FIGS. 1-5. Said terminology will include the words specifically mentioned, derivatives thereof, and words of similar import.

As used herein, an element or operation recited in the singular and proceeded with the word "a" or "an" should be understood as not excluding plural elements or operations, unless such exclusion is explicitly recited. Furthermore, references to "one embodiment" of the present disclosure are not intended to be interpreted as excluding the existence of additional embodiments that also incorporate the recited features.

As stated above, approaches herein provide a power distribution housing including a breathable vent that permits the power distribution housing to be coupled to a flush-mount surface. Advantageously, the vent, which may be provided directly adjacent the mounting surface, allows a fluid such as air to flow in and out of the power distribution housing, thus ensuring that a large pressure differential does not occur, e.g., due to self-heating of components (e.g., fuses) within the power distribution housing. Minimizing the pressure differential between the interior of the power distribution housing and the exterior of the power distribution housing decreases stress on the seals and latches of the power distribution housing. Furthermore, the vent may include multiple channels extending along a bottom wall of the power distribution housing to increase air flow and decrease potential for obstruction from contaminants. Providing the vent through a bottom wall of the power distribution housing enables the power distribution housing to be mounted in a variety of diverse locations, thus increasing versatility and value.

Although not limited to any particular implementation, embodiments herein describe a housing appropriate for use with a multi-drop bus (MDB) 5-way power distribution module, which is an internally bussed, water-proof and dust-proof power distribution module developed for high current loads, and harsh conditions, and is well-suited for near-the-battery applications. MDB 5-way power distribution modules can be configured with 2 or 3 MIDI® fuses mounted in exposed locations to fit a desired design. In some examples, the MDB series fuse holder includes a cover seal and M5 thread bolts for a fuse installation.

Figure 2:
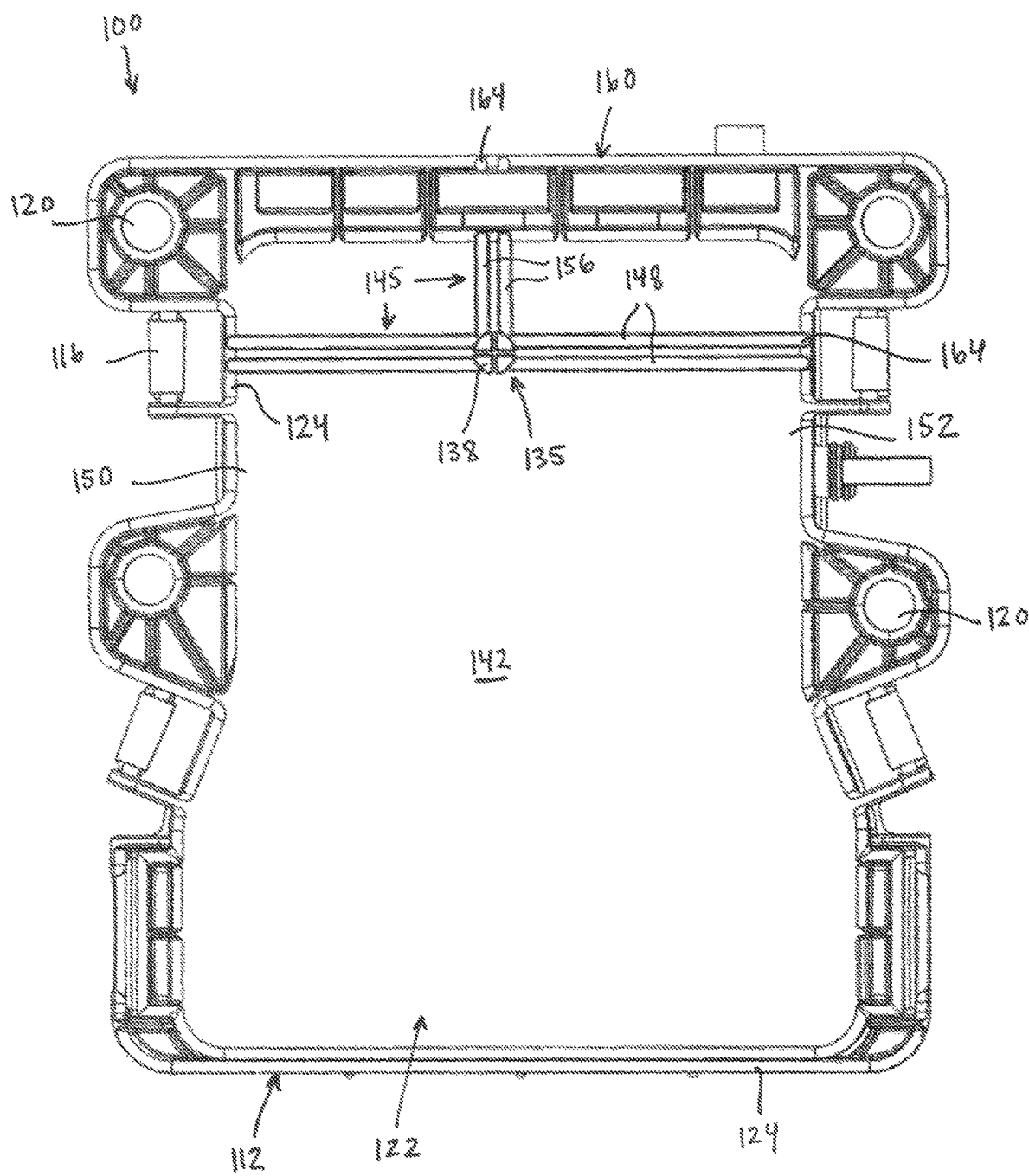
FIG. 2 is a bottom view of a power distribution housing of the power distribution assembly shown in FIG. 1 according to embodiments of the present disclosure.
Figure 3:
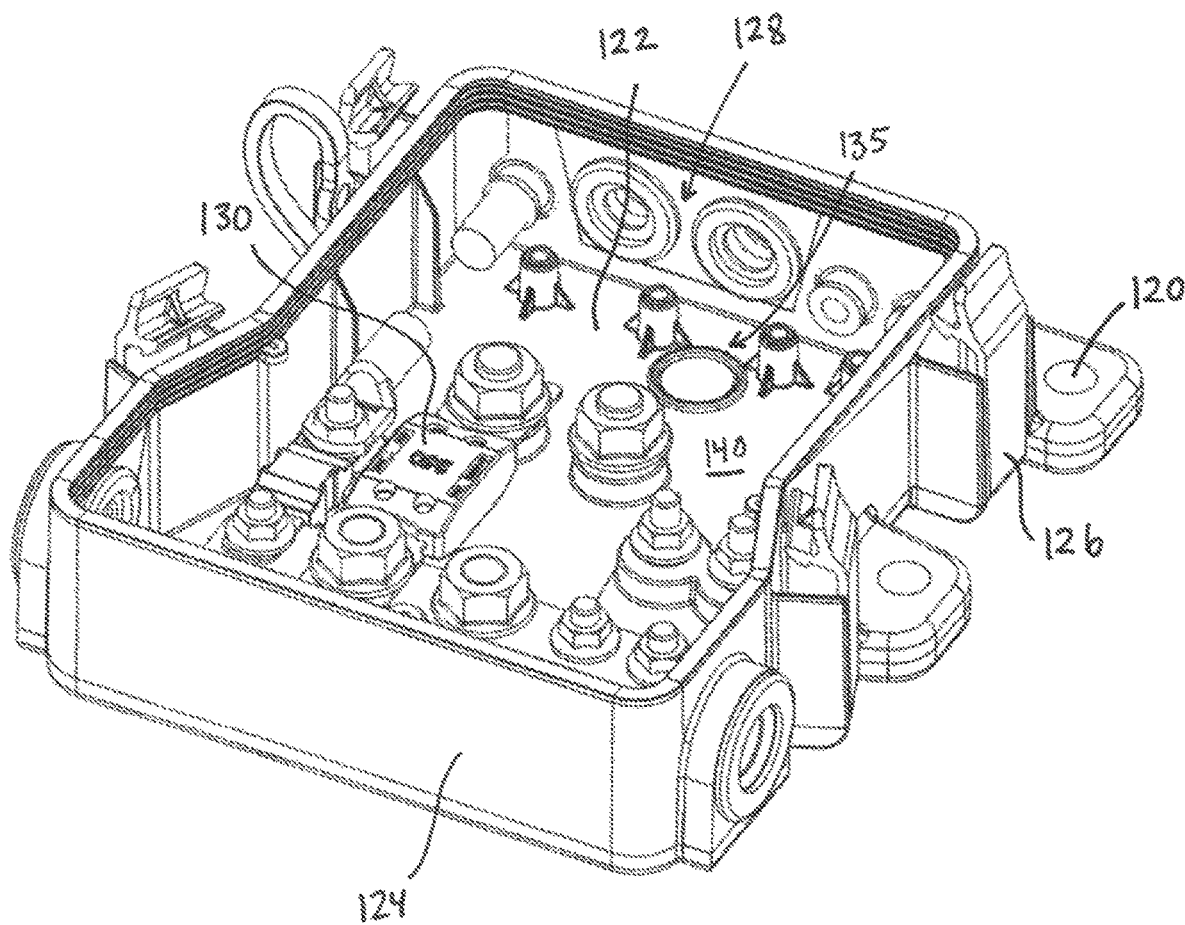
FIG. 3 is an isometric view of the power distribution housing of the power distribution assembly shown in FIG. 1, without a cover, according to embodiments of the present disclosure.

Referring to FIGS. 1-3, an exemplary embodiment of a power distribution assembly (hereinafter "assembly") 100 in accordance with the disclosure is shown. The assembly 100 includes a power distribution housing (hereinafter "housing") 110 having a base 112 coupled to a cover 114, the cover 114 removably connected to the base 112 and covering the circuit protection components therein. The cover 114 can be removed, for example, to replace an opened fuse or to inspect the power distribution grid. The cover 114 may include a seal that prevents dust, moisture and other contaminants from reaching the circuit protection devices. As shown, the housing 110 may be placed atop and coupled to a flush-mount surface (hereinafter "surface") 115.

In one embodiment, the cover 114 can snap-fit to the base 112 and/or include one or more latching mechanisms 116 to releasably secure the cover 114 to the base 112. Although not specifically illustrated, the cover 114 may also include means to further facilitate grasping and removal, such as tabs, projections, recesses, etc.

The base 112 may include a main wall 122 and a sidewall 124 extending from the main wall 122. As shown, the sidewall 124 may be oriented perpendicular to the main wall 122. Furthermore, the sidewall 124 may extend around all or part of a perimeter of the main wall 122. As best shown in FIG. 3, the cover 114 and the base 112 define an interior cavity 128 operable to house at least one fusible element 130 therein. In some embodiments, the fusible element 130 may be coupled to the base 112.

In some embodiments, the base 112 may include set of interlocking features for mounting multiple housing assemblies together, as well as one or more mounting apertures 120 for securing the base 112 to the surface 115. In some embodiments, the housing 110 may be made of an insulating material, such as plastic, which is molded to form a demonstrated shape. In some embodiments, the base 112 and the cover 114 can be made of the same or different materials, such as an insulating plastic, e.g., nylon, glass-filled nylon, polyester and polycarbonate.

The fusible element 130 and other components are illustrated for automotive uses, such as for cars, trucks, motorcycles, boats, wave-runners, all-terrain vehicles and other types of sports vehicles or others listed above. However, the teachings of the present disclosure and the benefits and advantages of the assembly 100 are not limited to vehicle type applications.

As shown in FIGS. 2-3, the base 112 may include a vent 135 through the main wall 122. The vent 135 may include a vent opening 138 extending between an interior surface 140 of the main wall 122, and an exterior surface 142 of the main wall 122. The vent 135 may further include a plurality of passageways 145 extending between the vent opening 138 and the sidewall 124. As shown, the plurality of passageways 145 are recessed into the exterior surface 142 of the main wall 122 of the base 112. Although not limited to any particular configuration, the plurality of passageways 145 may include a first pair of passageways 148 extending between a first side 150 and a second side 152 of the main wall 122 of the base 112, and a second pair of passageways 156 extending perpendicularly from the first pair of passageways 148. The first and second pairs of passageways 148, 156 are fluidly connected with the vent opening 138. As shown, the second pair of passageways 156 extend between the vent opening 138 and a first end 160 of the main wall 122 of the base 112. The first and second pairs of passageways 148, 156 define a plurality of outlets 164 through the sidewall 124 of the base 112, wherein the plurality of outlets 164 provide fluid (e.g., air) communication between the interior cavity 128 and atmosphere external to the housing 110.

Figure 4A:
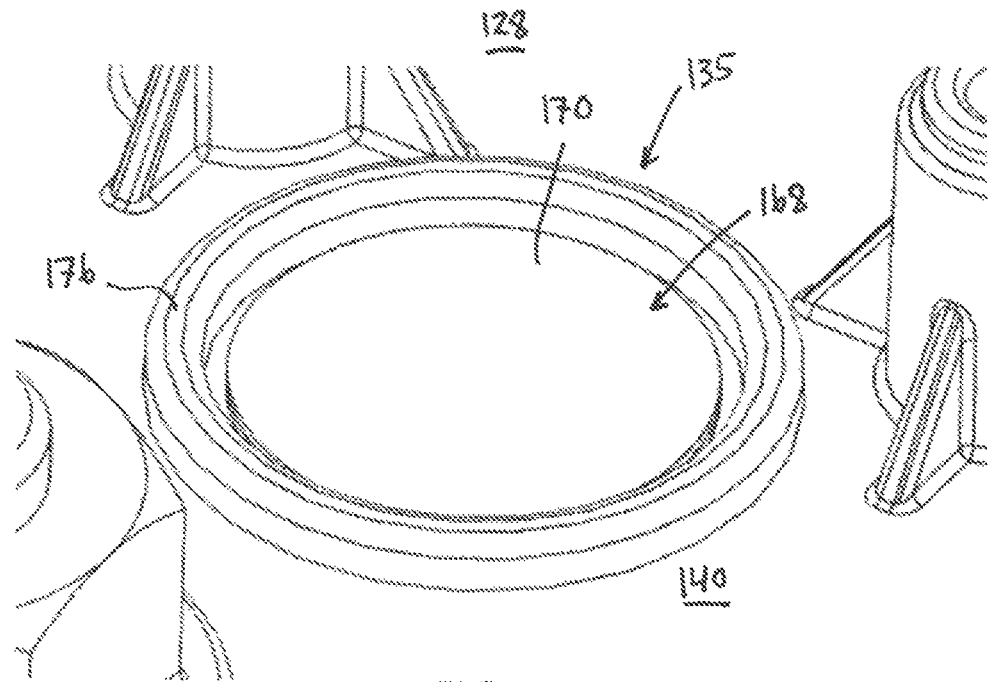
FIGS. 4A-4B are close-up isometric views of a vent through the power distribution housing according to embodiments of the present disclosure.
Figure 4B:
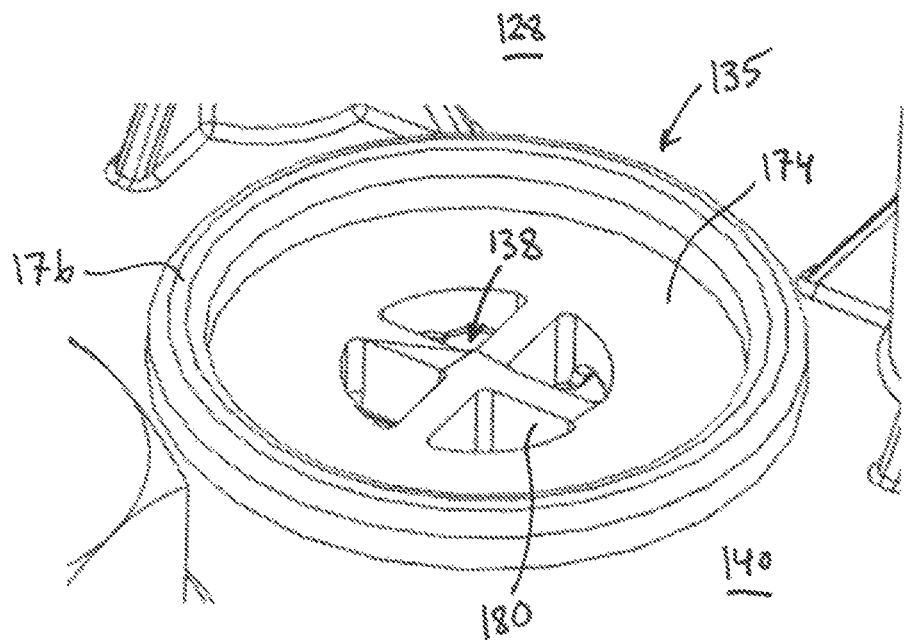
Figure 4C:
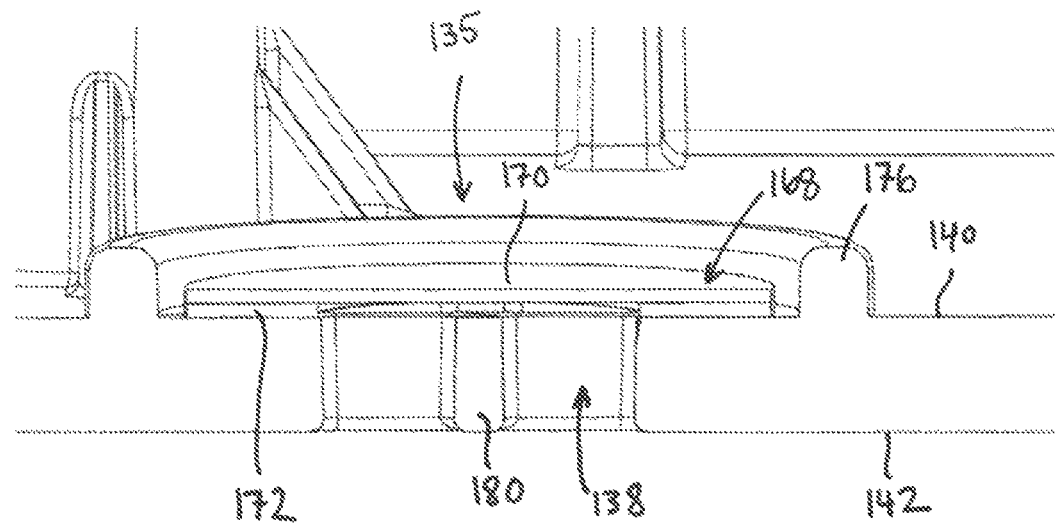
FIG. 4C is a side cross-sectional view of the vent of FIG. 4A according to embodiments of the present disclosure.

Turning now to FIGS. 4A-4C, the vent 135 according to embodiments of the present disclosure will be described in greater detail. FIG. 4A-4B show the vent 135 with a cover 168 provided thereover, while FIG. 4C shows the vent 135 with the cover 168 removed. In some embodiments, the cover includes a membrane 170 attached to an adhesive 172, which is then secured to an interior perimeter face 174 of the vent 135. The adhesive 172 may be shaped as a ring having a central opening. As shown, the vent 135 may include a target frame 176 circumscribing the vent opening 138, wherein the target frame 176 extends from the interior surface 140 into the interior cavity 128. The target frame 176 may be provided to align the cover 168 over the vent opening 138. The membrane 170 may be an expanded polytetrafluoroethylene membrane, which is both waterproof and breathable to allow air to pass therethrough. The vent 135 may include one or more support components 180 extending across the vent opening 138. Although non-limiting, the one or more support components 180 may take on a cross or bullseye configuration. Furthermore, although the target frame 176 and the cover 168 are cylindrically shaped, other configurations for both are possible in various embodiments.

Figure 5:
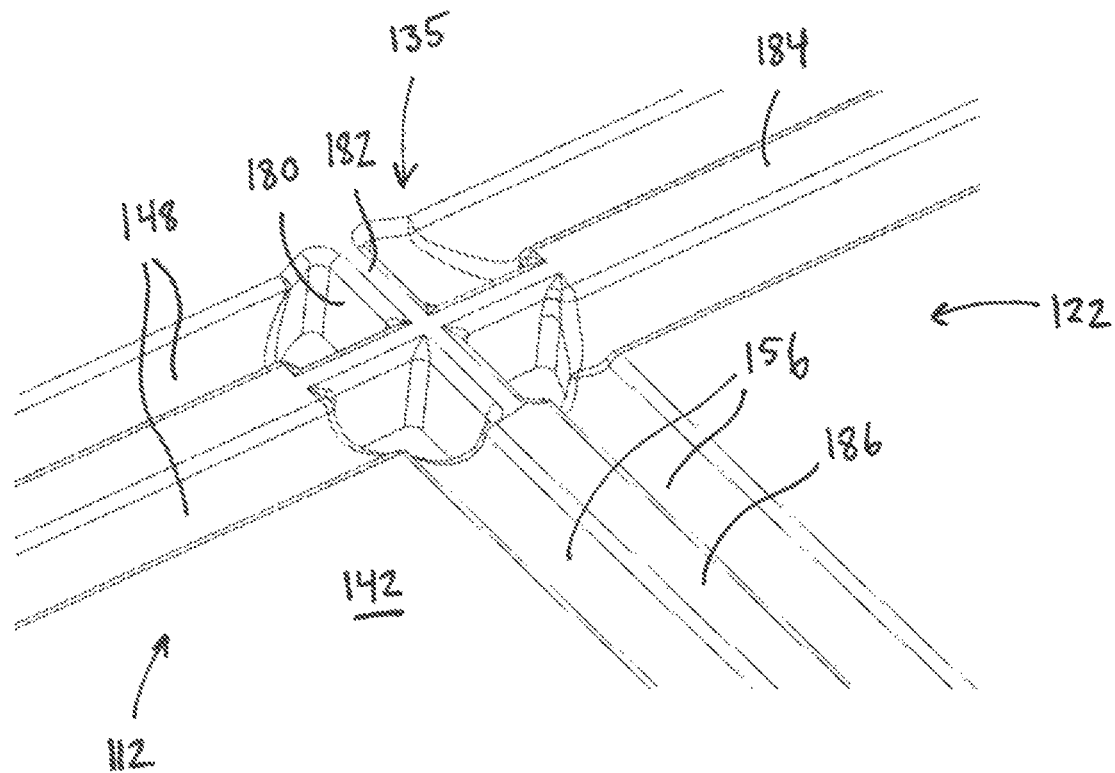
FIG. 5 is bottom isometric view of the vent through the power distribution housing according to embodiments of the present disclosure.

As shown in FIG. 5, each of the support components 180 has an exterior surface 182 planar with the exterior surface 142 of the main wall 122 of the base 112. As such, the exterior surface 182 of the support components 180 is flush with the surface 115 (FIG. 1). Furthermore, the exterior surface 182 connects to planar divider surfaces 184, 186, which separate each of first and second pairs of passageways 148, 156. The planar divider surfaces 184, 186 may also be flush with the surface 115. As shown, the first and second pairs of passageways 148, 156 are fluidly connected with one another.

While the present disclosure has been described with reference to certain approaches, numerous modifications, alterations and changes to the described approaches are possible without departing from the sphere and scope of the present disclosure, as defined in the appended claims. Accordingly, it is intended that the present disclosure not be limited to the described approaches, but that it has the full scope defined by the language of the following claims, and equivalents thereof. While the disclosure has been described with reference to certain approaches, numerous modifications, alterations and changes to the described approaches are possible without departing from the spirit and scope of the disclosure, as defined in the appended claims. Accordingly, it is intended that the present disclosure not be limited to the described approaches, but that it has the full scope defined by the language of the following claims, and equivalents thereof.

The invention claimed is:

1. A power distribution housing, comprising:
a base comprising:
 a main wall;
 a sidewall extending from the main wall;
 a vent through the main wall, the vent including:
  a vent opening extending between an interior surface of the main wall and an exterior surface of the main wall; and
  a plurality of passageways recessed into the exterior surface of the main wall, the plurality of passageways extending between the vent opening and the sidewall; and
a cover removably coupled to the base, the cover and the base defining an interior cavity operable to house at least one fusible element.

2. The power distribution housing of claim 1, the vent further comprising a cover extending over the vent opening.

3. The power distribution housing of claim 2, wherein the cover is a waterproof and breathable cover.

4. The power distribution housing of claim 2, wherein the cover comprises a membrane coupled to an adhesive, and wherein the adhesive is directly attached to an interior perimeter face of the vent.

5. The power distribution housing of claim 4, wherein the membrane is an expanded polytetrafluoroethylene membrane.

6. The power distribution housing of claim 1, the vent further comprising at least one support component extending across the vent opening.

7. The power distribution housing of claim 1, the vent further comprising a target frame circumscribing the vent opening, wherein the target frame extends into the interior cavity from the interior surface of the main wall of the base.

8. The power distribution housing of claim 1, the plurality of passageways comprising:
a first pair of passageways extending between a first side and a second side of the main wall of the base; and
a second pair of passageways extending perpendicularly from the first pair of passageways, the second pair of passageways extending to a first end of the main wall of the base.

9. The power distribution housing of claim 8, the first and second pairs of passageways defining outlets through the sidewall of the base.

10. The power distribution housing of claim 8, wherein the first and second pairs of passageways and the vent opening are fluidly connected.

11. A power distribution assembly, comprising:
a power distribution housing having a base and a cover defining an interior cavity operable to house at least one fusible element, the base comprising:
 a main wall flush mountable on a surface;
 a sidewall extending from the main wall;
 a vent through the main wall, the vent including:
  a vent opening extending between an interior surface of the main wall and an exterior surface of the main wall; and
  a plurality of passageways recessed into the exterior surface of the main wall, the plurality of passageways extending between the vent opening and the sidewall.

12. The power distribution assembly of claim 11, the vent further comprising a cover extending over the vent opening, wherein the cover is a waterproof and breathable cover.

13. The power distribution assembly of claim 12, wherein the cover comprises an expanded polytetrafluoroethylene membrane coupled to an interior perimeter face of the vent by an adhesive.

14. The power distribution assembly of claim 11, the vent further comprising a target frame circumscribing the vent opening, wherein the target frame extends into the interior cavity from the interior surface of the main wall of the base, and wherein the vent opening includes a support component.

15. The power distribution assembly of claim 11, the plurality of passageways comprising:
a first pair of passageways extending between a first side and a second side of the main wall of the base; and
a second pair of passageways extending perpendicularly from the first pair of passageways, the second pair of passageways extending to a first end of the main wall of the base, wherein the first and second pairs of passageways define outlets through the sidewall of the base.

16. A power distribution housing, comprising:
a base couplable with a cover, wherein the cover and the base define an interior cavity containing at least one fusible element coupled to the base, and wherein the base comprises:
 a main wall;
 a sidewall extending from the main wall;
 a vent through the main wall, the vent including:
  a vent opening extending between an interior surface of the main wall and an exterior surface of the main wall; and
  a plurality of passageways recessed into the exterior surface of the main wall, the plurality of passageways extending between the vent opening and the sidewall.

17. The power distribution housing of claim 16, the vent further comprising a waterproof and breathable cover.

18. The power distribution housing of claim 17, wherein the waterproof and breathable cover comprises a membrane coupled to an adhesive, and wherein the adhesive is directly attached to an interior perimeter face of the vent.

19. The power distribution housing of claim 16, the plurality of passageways comprising:
a first pair of passageways extending between a first side and a second side of the main wall of the base; and a second pair of passageways extending perpendicularly from the first pair of passageways, the second pair of passageways extending to a first end of the main wall of the base.

20. The power distribution housing of claim 19, the first and second pairs of passageways defining outlets through the sidewall of the base.

* * * * *